US010503243B1

(12) United States Patent
Beletsky et al.

(10) Patent No.: US 10,503,243 B1
(45) Date of Patent: Dec. 10, 2019

(54) INSTRUMENTING LOW POWER COVERAGE COUNTERS IN EMULATION

(71) Applicant: CADENCE DESIGN SYSTEMS, INC., San Jose, CA (US)

(72) Inventors: Platon Beletsky, San Jose, CA (US); Bing Zhu, San Jose, CA (US); Jennifer Lee, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 378 days.

(21) Appl. No.: 15/387,585

(22) Filed: Dec. 21, 2016

(51) Int. Cl.
*G06F 17/50* (2006.01)
*G06F 1/3287* (2019.01)
*G06F 11/273* (2006.01)
*G06F 11/22* (2006.01)

(52) U.S. Cl.
CPC ........ *G06F 1/3287* (2013.01); *G06F 11/2247* (2013.01); *G06F 11/2733* (2013.01); *G06F 17/50* (2013.01)

(58) Field of Classification Search
None
See application file for complete search history.

(56) References Cited

U.S. PATENT DOCUMENTS

| | | | | |
|---|---|---|---|---|
| 7,739,629 B2 * | 6/2010 | Wang | ................. | G06F 17/505 703/14 |
| 8,352,235 B1 * | 1/2013 | Lin | ................. | G06F 17/5036 703/14 |
| 2006/0277509 A1 * | 12/2006 | Tung | ................. | G06F 17/5022 716/109 |
| 2009/0271167 A1 * | 10/2009 | Zhu | ................. | G06F 17/5027 703/14 |

OTHER PUBLICATIONS

Bhattacharjee, Abhishek et al., "Full-System Chip Multiprocessor Power Evaluations Using FPGA-Based Emulation", Aug. 11-13, 2008, ISLPED '08, ACM. (Year: 2008).*
Garat, Emilie et al., "Unified Power Format (UPF) Methodology in a Vendor Independent Flow", 2015, IEEE. (Year: 2015).*
Ramezani, Mehran et al., "A Better Tool for Functional Verification of Low-Power Designs with IEEE 1801 UPF", 2014, Cadence Design Systems, Inc. (Year: 2014).*

* cited by examiner

*Primary Examiner* — Cedric Johnson
(74) *Attorney, Agent, or Firm* — Eric L. Sophir; Dentons US LLP

(57) ABSTRACT

Disclosed herein are systems and methods of an emulation system. A hardware emulator of an emulation system includes a method of hardware emulation on a computer. The method may include reading in, by the computer, a hardware description language file and a low power intent file and compiling the hardware description language file and the low power intent file into an emulation image. Embodiments may include loading, the emulation image into an emulator, running, the emulation image under a test environment including using a coverage counter specific to low power coverage, created based on the hardware description language file and the low power intent file, using the coverage counters to inform the test environment, generating, by the computer, a report file including a set of low power coverage metrics based on a low power coverage data item, and presenting the report file to a user via a user interface.

17 Claims, 9 Drawing Sheets

| Low power object type | Coverage item (1 counter) | Coverage toggle (2 counters) | Capacity increase (counters) |
|---|---|---|---|
| Power domain | | simState | 2 |
| Isolation | | isIsolationAction | 4 |
| | | isoSignals | |
| Retention | saveWithCondTrue | isRetentionActive | 8 |
| | saveWithCondFalse | retentionCondToggle | |
| | restoreWithCondTrue | | |
| | restoreWithCondFalse | | |
| Power switch | | <state>Toggle | 2 |
| Supply net | Off | | 4 |
| | Undetermined | | |
| | Partial_on | | |
| | Full_on | | |
| Supply set | | simState | 2 |
| Supply port state | | isState | 2 |
| Port state table state | | isState | 2 |
| Power state | | isState | 2 |
| Power state transition | isHappened | | 1 |

```
set_design_top tb/dut

#VDD
create_supply_port VDD
create_supply_net VDD
connect_supply_net VDD -ports (VDD)

#VSS
create_supply_port VSS
create_supply_net VSS
connect_supply_net VSS -ports (VSS)

#VDD_sv
create_supply_net VDD_sv0
create_supply_not VDD_sv1 create_supply_set VDD_VSS -hurtion {power VDD} -function {ground VSS}
create_supply_set VDD_VSS_sv0 -function {power VDD_sv0} -function {ground VSS}
create_supply_set VDD_VSS_sv1 -function {power VDD_sv1} -function {ground VSS} create_power_domain PD_Def -include scope -supply (primary VDD_VSS) -power_up_states high
create_power_doiman PD_bank0 -elements (bank_0) -supply (primary VDD_VSS_sv0) -power up states high
create_power_domain PD_bank1 -elements (bank_1 bank_0) -exclude elements (bank O) -supply (primary VDD_VSS_sv0)
        -power_up_states high
create_power_domain PD__bank2 -elements (bank_2) -supply (primary VDD_VSS_sv1) -power_up_states high create_power_switch sv_0 -domain PD_bank0 -supply_set VDD_VSS \
        -output_supply_port (out VDD_sv0) \
        -input_supply_port (in VDD) \
        -control_port (cntrl al/pso) \
        -on state { sv_ON in {cntrl} \
$ common save/restore signal
set_retention ret_0 -domain PD_bank0 \
        -retention_supply_set VDD _VSS \
        -save_signal (save restore posedge) -restore signal (save restore negedge)
set_retention_control ret_0 -domain PD_bank0 -save signal (save restore posedge) -restore signal (save restore negedge)

set_isolation iso0 -domain PD_bank0 \
        -applies_to outputs \
        -isolation_supply_set VDD_VSS \
        -clamp_value 0 \
        -isolation_signal iso \
        -isolation_ sense high set_isolation iso1 -domain PD_bank1 \
        -applies_to outputs \
        -isolation_power_net VDD \
        -isolation_ground_net VSS \
        -clamp_value 0
set_isolation_control isol -domain PD_bank1 \
        -isolation signal iso \
        -isolation_sense high add_port_state VDD sv1 -state ( x1on 1.0 ) -state ( x1off off )
add_port_state VDD sv2 -state ( x2on 1.0 ) -state ( x2off off )

create_pst TABLE_1 -supplies (VDD_sw1)
add_pst_state off -pst TABLE_1 -state (x1off)
add_pst_state on  -pst TABLE_1 -state (x1on)
```

SupplyNet, VDD, FULL_ON, 1
SupplyNet, VDD, PARTIAL_ON, 0
SupplyNet, VVD, UNDETERMINED, 0
SupplyNet, VDD, OFF, 0
SupplyNet, VSS, FULL_ON, 1
SupplyNet, VSS, PARTIAL_ON, 0
SupplyNet, VSS, UNDETERMINED, 0
SupplyNet, dut VSS, OFF, 0
SupplyNet, dut VDD_sv0, FULL_ON, 3
SupplyNet, dut VDD_sv0, PARTIAL_ON, 0
SupplyNet, dut VDD_sv0, UNDETERMINED, 0
SupplyNet, dut VDD_sv0, OFF, 3
SupplyNet, dut VDD_sv1, FULL_ON, 3
SupplyNet, dut VDD_sv1, PARTIAL_ON, 0
SupplyNet, dut VDD_sv1, UNDETERMINED, 0
SupplyNet, dut VDD_sv1 , OFF, 3
SupplySet, dut VDD_VSS, NORMAL, 1
SupplySet, dut VDD_VSS, CORRUPT, 0
SupplySet, dut VDD_VSS_sv0, NORMAL, 3
SupplySet, dut VDD_VSS_sv0, CORRUPT, 3
SupplySet, dut VDD_VSS_sv1, NORMAL, 3
SupplySet, dut VDD_VSS_sv1, CORRUPT, 3
PowerDomain, dut PD_Def, NORMAL, 1
PowerDomain, dut. PD_Def CORRUPT, 0
PowerDomain, dut. PD_bank0, NORMAL, 3
PowerDomain, dut. PD_bank0, CORRUPT, 3
PowerDomain, dut. PD_bank1, NORMAL, 3
PowerDomain, dut. PD_bank1, CORRUPT, 3
PowerDomain, dut. PD_bank2, NORMAL, 3
PowerDomain, dut. PD_bank2, CORRUPT, 3
SupplyPortState, dut VDD_sv1 x1on, True , 3
SupplyPortState, dut. VDD_sv1 x1on, False, 3
SupplyPortState, dut. VDD_sv1 x1off True, 3
SupplyPortState, dut. VDD_sv1 x1off, False, 3
SupplyPortState, dut. VDD_sv2 x2on, True, 3
SupplyPortState, dut. VDD_sv2 x2on, False, 3
SupplyPortState, dut. VDD_sv2 x2on, True, 3
SupplyPortState, dut. VDD_sv2 x2on, False, 3
PSTState. dut TABLE_1. off, True, 3
PSTState, dut TABLE _1. off, False, 3
PSTState, dut TABLE_2. on, True, 3
PSTState, dut TABLE _1. on, False, 3
SwitchState, dut. sw_0. sv_ON, True, 3
SwitchState, dut. sw_0. sv_ON, False, 3
Isolation, iso0, Active, 0
Isolation, iso0, NotActive, 1
Isolation, iso0, IsolationSignal, iso, PosEdqe, 0
Isolation, iso0, IsolationSignal, iso, NegEdge, 1
Isolation, iso0, SupplySet, dut. VDD_VSS, NORMAL, 1
Isolation, iso0, SupplySet, dut. VDD_VSS, CORRUPT, 0
Isolation, iso1, Active, 0
Isolation, iso1, NotActive, 1
Isolation, iso1, IsolationSignal, iso, PosEdge, 0
Isolation, iso1, IsolationSignal, iso, NegEdge, 1
Isolation, iso1, SupplyNet, dut. VDD, FULL_ON, 1
Isolation, iso1, SupplyNet, dut. VDD, PARTIAL_ON, 0
Isolation, iso1, SupplyNet, dut. VDD, UNDETERMINED, 0
Isolation, iso1, SupplyNet, dut. VDD, OFF, 0
Isolation, iso1, SupplyNet, dut. VSS, FULL_ON, 1
Isolation, iso1, SupplyNet, dut. VSS, PARTIAL ON, 0
Isolation, iso1, SupplyNet, dut. VSS, UNDETERMINED, 0
Isolation, iso1, SupplyNet, dut. VSS, OFF, 0
Retention, dut. ret_0, Active, 2
Retention, dut. ret_0, NotActive, 3
Retention, dut. ret_0, SaveWithCondTrue, 2
Retention, dut. ret_0, RestoreWithCondTrue, 2
Retention, dut. ret_0, SupplySet, dut. VDD_VSS, NORMAL, 1
Retention, dut. ret_0, SupplySet, dut. VDD_VSS, CORRUPT, 0

FIG. 8

INSTRUMENTING LOW POWER COVERAGE COUNTERS IN EMULATION

TECHNICAL FIELD

This application relates generally to design verification systems for integrated circuits (ICs) and more particularly to the use of hardware-based functional verification systems for reporting low power design and low power activities coverage of IC designs.

BACKGROUND

Hardware-based functional verification systems include logic emulation systems and simulation acceleration systems. In logic emulation systems, IC designs may be translated into an emulation image, and the emulation image run in the emulator. In simulation acceleration systems, IC designs may be divided into two parts, one part may be handled by a simulator, and another part may be handled by an emulator.

Compared to simulators, emulation systems have two major advantages. One advantage includes that the emulator may have dedicated hardware that performs the IC design functions in massive parallel, and therefore the emulator runs at a speed that is orders of magnitude faster than simulators. The other advantage is that the emulator can run with IC designs' real software systems and under IC designs' real target systems. In other words, emulator systems may emulate IC designs with a real system, so that IC designs' firmware and software systems may be tested with IC designs before IC designs are fabricated.

Verification of a low power design in the early design stage is becoming more popular and in demand. A low power design includes an IC design with low power intent. In general, the IC design's functional part may be written in an HDL (Hardware Design Language), such as Verilog/System Verilog, and Very High Speed Integrated Circuit HDL (VHDL). The IC design's power intent may be specified in low power intent languages, such as Institute of Electrical and Electronics Engineers (IEEE) 1801 UPF (Unified Power Format) or CPF (Common Power Format). Power intent files can be either a UPF or a CPF file.

A coverage metrics report may be a good measurement of the completeness of IC designs' verification. System Verilog includes a coverage mechanism for code coverage and function coverage. This guides the IC designs' HDL coverage metrics and report. Users may generate reports on code coverage and function coverage for low power objects based on UPF or CPF files' contents.

Simulators may include low power coverage. Current simulator technologies can create System Verilog files that include coverage models and/or coverage groups within their design. This approach may require re-compilation and complicate the compilation process. This approach also may require the installation of coverage monitors, which impacts simulation performance. There is a need, therefore, for a different approach for emulator low power coverage, with less performance impact.

SUMMARY

Embodiments described herein attempt to address the issues related to low power coverage metrics reporting in emulation systems. Disclosed herein are systems and methods of low power coverage metrics reporting performed by use of coverage counters in the emulator hardware. Compilation is simplified since no additional user design or additional HDL files are generated. Therefore, no changes are necessary from the designer for compilation to create low power coverage metrics reports. Additionally, run-time is not impacted because the counters are read directly without stopping the emulator.

Low power objects used in coverage metrics reporting may be selected based on the power intent files, such as UPF and/or CPF. Capacity increases for the low power coverage counters is similarly insignificant in comparison to the overall size of the integrated circuit (IC) designs. Hundreds or thousands of low power objects may be present, while millions of IC design components are present overall.

Some embodiments include counters instrumented in an emulator. It may be possible to reset and/or suspend metrics reporting during run-time without any penalty on performance. This run-time capability in emulation is in contrast to simulation of low power designs that require full recompilation of the simulator image and require installation (and constant updating) of coverage monitors. Some embodiments include usability improvements for coverage reports. For example, the coverage report content may be scalable. Coverage objects may be excluded from the coverage reports based on their type or the instances where they are in the design.

Some embodiments include a hardware emulation system which includes the emulation device coupled to a processor and memory. The processor may be configured to receive a hardware description language file and a low power intent file and compile the hardware description language file and the low power intent file into an emulation image. The emulation image may include using a coverage counter configured for low power coverage, created based on the hardware description language file and the low power intent file. Additionally, the processor may be configured to load the emulation image into the emulation device and run the emulation image under a test environment. The test environment may use information from the coverage counters to control additional test inputs and test flow. Further, the processor may be configured to generate a report file automatically and/or on demand at any point in time with the report file including a set of low power coverage metrics based on a low power coverage data item and present the report file to a user via a user interface. The report file format may be correlated with other design data in time and within the design hierarchy. The report file format may also be viewed in realtime.

The test environment may change dependent on current design emulation state. Current state of coverage counters comprise part of the current design state and may also be used to inform the test environment, including to have the test environment inject different stimuli, for example by loading memories and/or forcing signals, and/or changing output messaging.

Low power coverage over a specified or cumulative time period may be stored into a waveform database. Therefore, the coverage report summary may be time-unrolled back in a waveform in order to view when the counters may change and correlate the changes with other changes in the user design. In some embodiments, IC design signals may be probed during emulation and correlated with low power coverage counter numbers. Therefore, it may be possible to check what the related IC design signals transitions look like when a low power object coverage is low.

In some embodiments, another usability improvement includes a web-based real-time coverage report display. Coverage reports for different test runs of the same circuit designs may be automatically summed in a web browser to provide a graph of increasing total coverage over multiple test runs. Embodiments offer a better performance, low power coverage method using emulation systems, and a user-friendly coverage report method.

In an embodiment, a method of hardware emulation comprises receiving, by a computer coupled to a processor and memory, a hardware description language file and a low power intent file; compiling, by the computer, the hardware description language file and the low power intent file into an emulation image; The emulation image may include using a plurality of coverage counters configured for low power coverage, the emulator image comprising a coverage counter instantiated for each of a plurality of low power constructs defined in the low power intent file. Additionally, the processor may be configured to load the emulation image into the emulation device and run the emulation image under a test environment. The test environment may use information from the coverage counters to control additional test inputs and test flow. The method further comprising generating, by the computer, a report file automatically and/or on demand at any point in time with the report file comprising a set of low power coverage metrics based on the plurality of coverage counters; and presenting, by the computer, the report file to a user via a user interface. The report file format may be correlated with other design data in time and within the design hierarchy. The report file format may also be viewed in realtime.

In another embodiment, a hardware emulation device comprises a memory; and a processor coupled to the memory, the processor configured to: receive, a hardware description language file and a low power intent file from the memory; compile, the hardware description language file and the low power intent file into an emulation image; The emulation image may include using a plurality of coverage counters configured for low power coverage, the emulator image comprising a coverage counter instantiated for each of a plurality of low power constructs defined in the low power intent file; generate, a report file automatically and/or on demand at any point in time with the report file including a set of low power coverage metrics based on the plurality of coverage counters; and present, the report file to a user via a user interface. The report file format may be correlated with other design data in time and within the design hierarchy. The report file format may also be viewed in realtime.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

FIG. 6 shows an exemplary set of low power objects and corresponding coverage items, according to an exemplary embodiment.

FIG. 7 shows a sample UPF input file, according to an exemplary embodiment.

FIG. 8 shows an output sample of a coverage report with counter width N=8, according to an exemplary embodiment.

DETAILED DESCRIPTION

Figure 1:
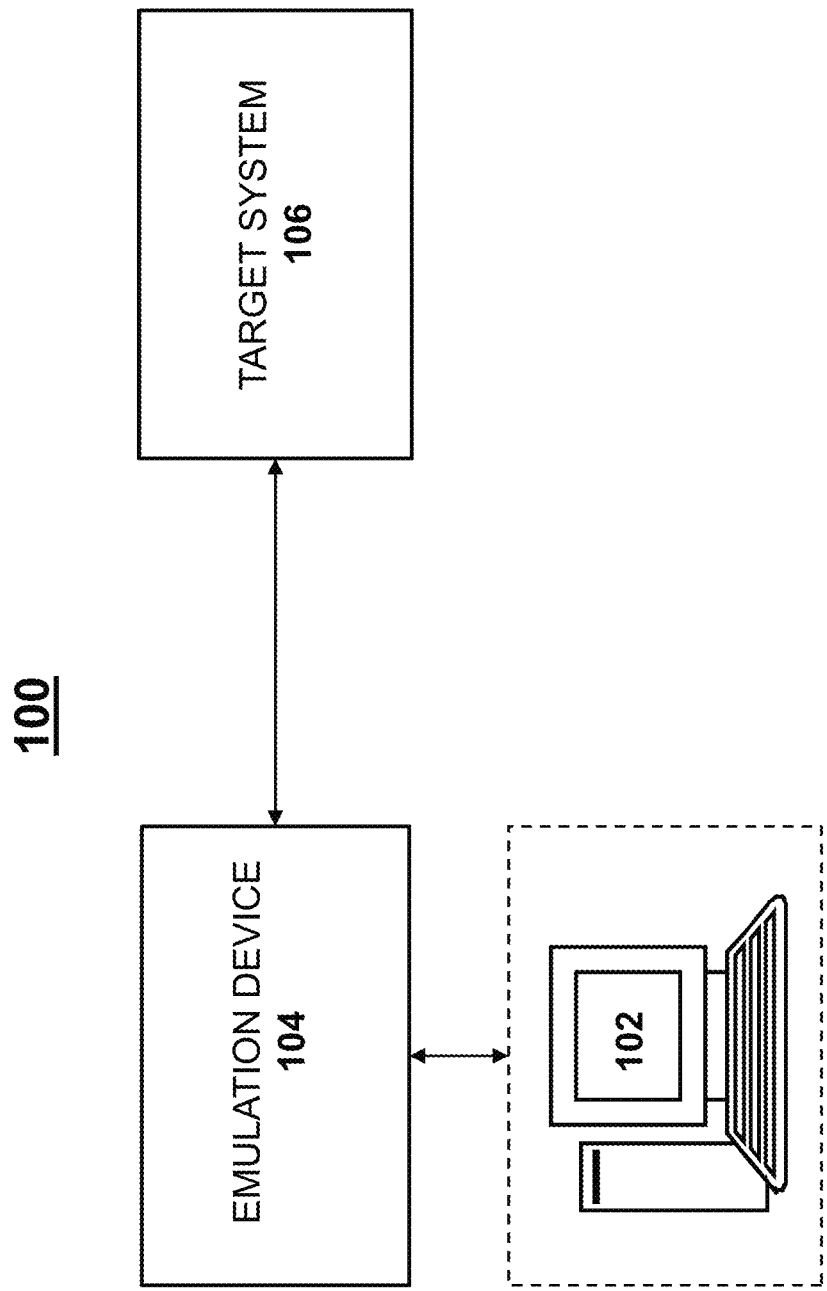
FIG. 1 is a schematic diagram showing components of an emulation system, according to an exemplary embodiment.

The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Hardware emulators are programmable devices used in the verification of hardware designs. Hardware emulators may include hardware components capable of processor or FPGA-based (e.g., hardware-based) emulation of logic systems, such as application specific integrated circuits (ASICs), central processing units (CPUs), graphics processing units (GPUs), and the like. By executing various forms of programmable logic, the hardware emulators may be programmed to mimic the functionality of nearly any prototype logic system design such as an integrated circuit, an entire board of integrated circuits, or an entire system that is undergoing testing. This mimicking of functionality allows logic system designers to prototype their logic system design using processor-based emulation before actually manufacturing the logic system, such as an ASIC product, thereby saving money by avoiding design failures.

The programs executed by processors in a hardware emulator may include instructions containing a sequence of operations. The processor typically corresponds to an instruction memory that is read sequentially and provides instructions that are used to read bits out of a data array. Each processor is connected to the data array that is a special memory, and has multiple read ports and supplies input data to the processor via each read port. The processor evaluates the data supplied from the data array in accordance with an instruction word supplied from an instruction memory. The processor does not always require input data from all of the read ports of the data array. The bits that are read from the data array are then fed to a lookup table (LUT) that is controlled by the instruction, and the result of the LUT function is then stored back into the data array. The data array stores outputs of the processor for an emulation cycle (in a single phase), such as coverage counters, and serves as the inputs to the processor. The data value produced by the processor may then be written to the data array at an address indicated by a step number of a current instruction.

FIG. 1 is a schematic diagram showing components of an emulation system 100, according to an exemplary embodiment. The emulation system 100 includes a computer workstation 102, an emulation device 104, and an optional target system 106.

The computer workstation 102 provides emulation support facilities to the emulation device 104. The computer workstation 102 may include at least one central processing unit (CPU), support circuits, and a memory. The CPU may include one or more microprocessors and/or microcontrollers. The support circuits may be circuits that are used to support the operation of the CPU. These circuits may include power supplies, docks, input/output interface circuitry, cache and the like. The computer workstation 102 may further include a memory that may comprise random access memory, read only memory, removable disk memory, flash memory, optical storage and various combinations of these types of memory. The memory may be a main memory and may in part be used as cache memory or buffer memory. The memory stores various forms of software and files, such as an operating system (OS) and a compiler.

The computer workstation 102 allows a user to interface with the emulation device 104, control the emulation process and collect emulation results and coverage reports for analysis. Under control of the computer workstation 102, programming information and data is loaded to the emulation device 104. For example, user designs including VHDL and Verilog netlists may be read in to the computer workstation 102. Similarly, power intent files such as UPF and CPF files may be read in to computer workstation 102. Computer workstation 102 may provide compilation capabilities for emulation image generation including creation of low power objects.

The emulation device 104 may be a collection of computing hardware capable of executing the emulation processes. The emulation device 104 is composed of individual emulation circuits. Typically, the emulation circuits are integrated circuits (also referred to herein as emulation chips). The emulation device 104 include racks housing emulation logic boards, emulation processors, and other computing hardware designed to emulate the designs of prototype application-specific integrated circuits (ASICs) and/or other logic systems. In some embodiments, the emulation device 104 may include a server computer having separate processors, which may execute software modules configured to manage and control the resources and performance of the emulation system 100 including low power coverage objects. Non-limiting examples of these software modules may include a compiler and a configuration manager stored in the memory. The emulation device 104 may be composed of individual emulation circuits. Typically, the emulation circuits are integrated circuits (also referred to herein as emulation chips or processors).

A compiler may be a software module, which may be executed by the computer workstation 102 or on the emulation device 104, and is configured to receive and compile a netlist design file containing the logical gate design of an ASIC or other logic system and power intent file, and then generates a virtual logic file based on the compiled netlist and input power intent files. The compiler may "map" logic of the ASIC (or other logic system) into the hardware components of the emulation system 100 to generate instructions for the emulation system's 100 components to function as the emulated ASIC or other logic system. The compiler may comprise a partitioner and scheduler component or function, though it should be appreciated that the compiler may be segmented into any number of component software modules. In an opening import phase, the compiler receives the netlist and power intent files and begins compiling. Here, the compiler may parse the logic gates of the netlist into a database format. The partitioner may determine which part of the netlist is going to be executed by which type and which instance of hardware resource of the emulation system 100. Similarly, at this stage low power coverage objects may be generated.

Then, a scheduler may determine for that part of the netlist which of the hardware resources should execute the part of the netlist and when in the execution cycle that logic component (e.g., gate, instruction, low power object) should be executed. The compiler may be capable of determining the status of components of the emulation system 100, including the allocation status of particular components or whether the resource is inoperable (e.g., marked-out).

A configuration manager may be a software module which is present and is executed by the computer workstation 102 or on the emulation device 104, and is configured to track the status and control the task performed of components of the emulation system 100. The configuration manager may determine which components of the emulation system 100 are available or unavailable to receive parts of the virtual logic generated by the compiler.

In response to the programming received from the emulation support facilities, the emulation device 104 emulates a user design. The user design may be an integrated circuit, a memory, a processor, or any object or device that can be emulated in a programming language. The emulation programming languages include Verilog and VHDL. As used herein, power intent files may be CPF files or UPF files.

An optional target system 106 may be connected to the emulation device to add external components to the run environment, either for test purposes or as the application TO.

Figure 2:
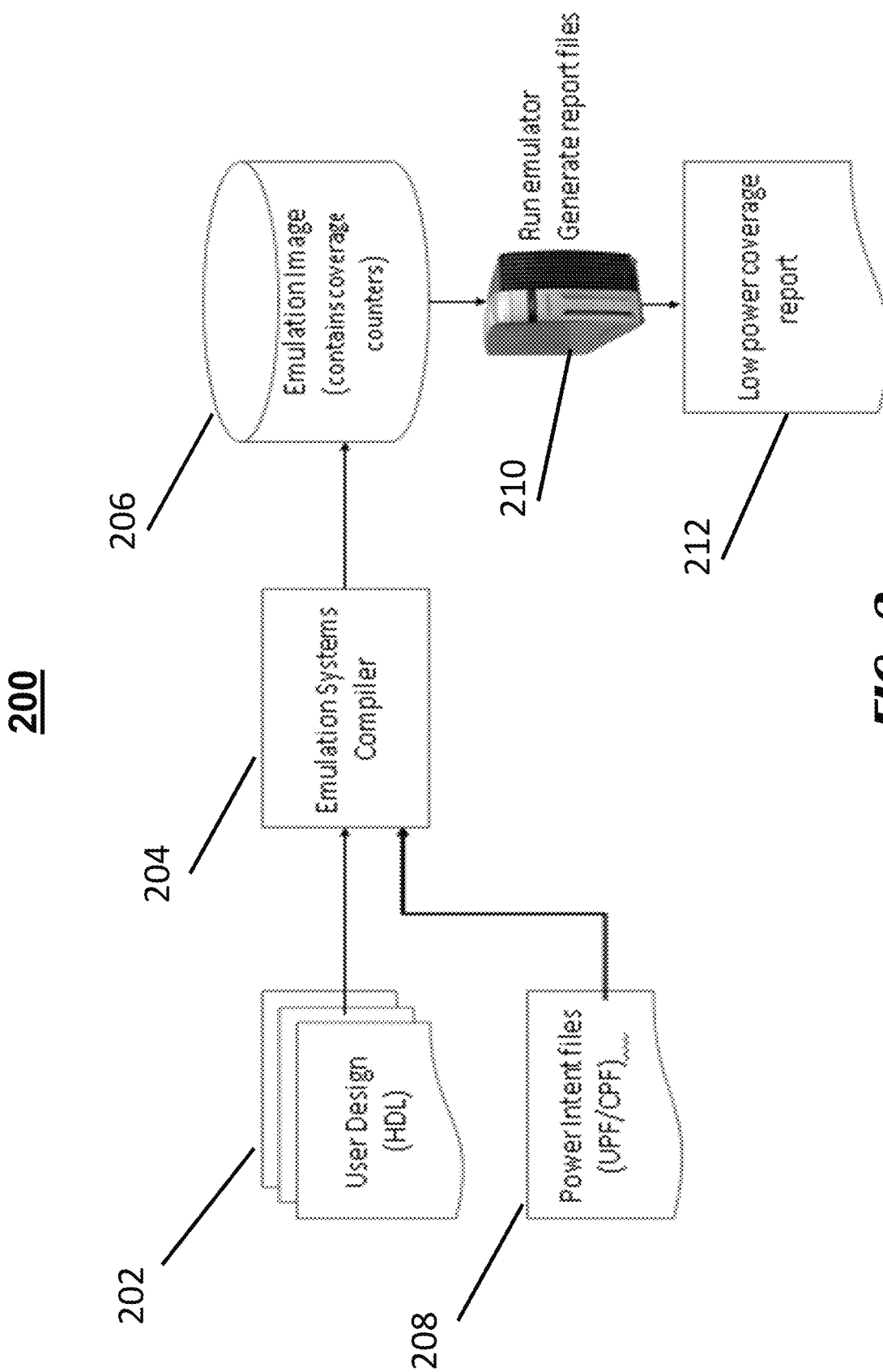
FIG. 2 is a schematic diagram showing a structure of low power coverage in an emulator system, according to an exemplary embodiment.

FIG. 2 is a schematic diagram showing a structure of low power coverage in an emulator system, according to an exemplary embodiment 200. Embodiment 200 may include user design 202, power intent files 208, emulation systems compiler 204, emulation image 206, emulator 210, and low power coverage report 212. Embodiment 200 may receive an HDL file from user design 202 and a UPF or CPF file from power intent files 208 and compile them on emulation systems compiler 204. Emulation systems compiler 204 may generate emulation image 206, which may contain coverage counters for low power. Emulator 210 may then take the emulation image and generate coverage report files, such as low power coverage report 212.

In some embodiments, emulation systems may read in HDL files, as well as low power intent files, and compile them into an emulation image. The emulation image may be loaded into the emulator and run under the test environment, and then coverage metrics reports can be generated. The power intent files may include lower power constructs (also referred to herein as objects). In one example, UPF files may include at least one construct selected from power domain, isolation, retention, power switching, supply nets, supply sets, supply port states, Port State Table (PST) state, power states, and/or power state transitions. CPF files may include at least one construct selected from power domain, isolation, retention, power mode, and others.

Emulator 210 may collect coverage data during emulation for the low power constructs. Each low power construct may be represented by one or more counters in the emulator systems. The coverage counter(s) may be width-adjustable. For example, when the maximum preset width is 8 bits, then the counter can be adjusted to be from 0 to 8 bits wide.

In one example, a coverage data structure may be declared by setting a counter width variable (such as "CounterWidthMax") to a constant integer value of eight. In this example, a new class may be created for a coverage data structure. The new class may include one or more data types such as an integer counter array set to the size of the counter width variable.

Figure 3:
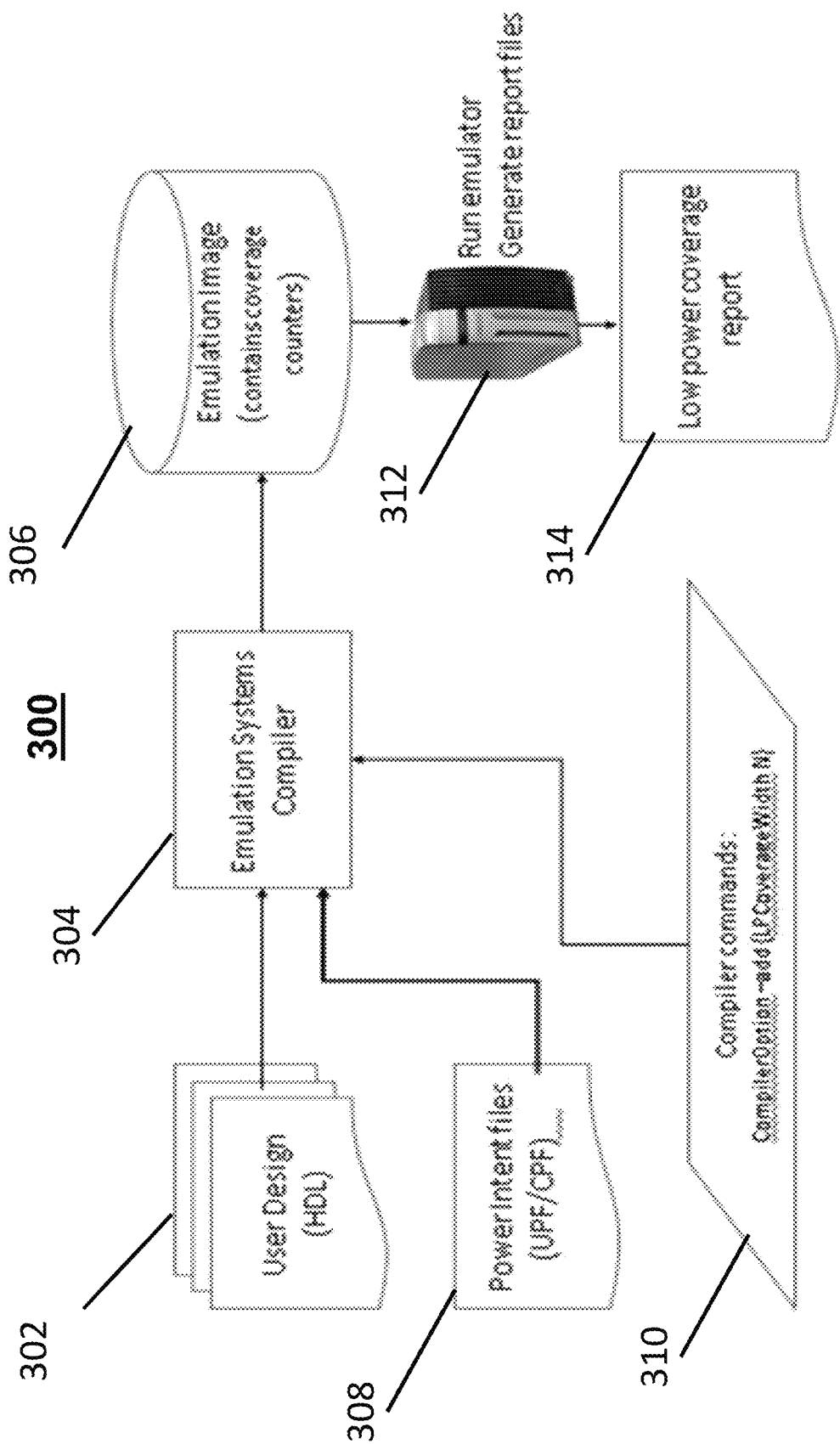
FIG. 3 is a schematic diagram showing counter adjustment within an emulation system, according to an exemplary embodiment.

The example coverage data structure may be declared as such:
    const int CounterWidthMax=8;
    class CoverItem {
    public:
    int m_counter[CounterWidthMax];
    . . .
    };

FIG. 3 is a schematic diagram showing counter adjustment within an emulation system, according to an exemplary embodiment 300. Embodiment 300 may include user design 302, power intent files 308, emulation systems compiler 304, emulation image 306, compiler commands 310, emulator 312, and low power coverage report 314.

Embodiment 300 illustrates how compiler commands may be used to adjust the default counter width. For example, the counter width may be adjusted between zero and a constant (discussed above), such as the maximum counter width. In one embodiment, when the counter is set as zero, the coverage metrics report may be disabled. An input to the emulation image 306 can change a coverage counter setting during a compilation process. A user may designate the low power counter coverage width in compiler commands 310, which are fed into the emulation image 306. Limiting the size of the coverage counters may help in runtime performance by reducing the memory used for low power constructs.

When a low power construct changes state during an emulation, the corresponding coverage counter may be increased by 1. Coverage counters may stop increasing when reaching the set maximum value, for example, $2^{N-1}$ for width N. When the coverage counter reaches the maximum value, the coverage counter may keep the maximum value.

A single coverage item may either include a coverage counter or a pair of counters for a number of positive edges (posedges) and negative edges (negedeges) on a certain signal or state. For example, power domain coverage may count the number of time intervals when the simstate (defined below) of this domain is characterized by "normal" and the number of intervals when the domain is characterized as "corrupt." A construct or construct attributes (e.g., toggle class) may be created to be associated with counters that capture coverage data at the positive and negative edges of the emulator clock signal for the particular coverage data structure representing the construct or construct attribute. The pair of counters may be defined as, for example:
    class CoverItemToggle {
    public:
    CoverItem m_negedge;
    CoverItem m_posedge;
    . . .
    };

In one illustrative example, low power constructs, such as power domain, power state, and state transition, are used to demonstrate instantiations of an attribute such as coverage item (CoverItem) or coverage toggle (CoverItemToggle). A power domain construct may include a collection of IC design elements that share a primary power supply. A power supply net construct may include various states, such as on, undetermined, off, and partial on, as well as a voltage value. The power state construct of a power domain may be determined by the states and voltage values of the power domain's supplies. When a power supply's states and/or voltages change, a power state may change to another power state, known as a power state transition. A simulation state (simState) construct may be instantiated as a toggle class under the power domain. The syntax may be presented as such:
    PowerDomain::CoverItemToggle simState
which shows that in the description of power domains, there exists a coverage toggle with the name 'simState'.

In the illustrative example above, the PowerDomain definition may instruct the compiler to toggle the state on the given power domain's level of operational capability supported by a power supply. The simState may have states such as normal or corrupt. The normal state may indicate that the supply of this power domain is on, and the corrupt state may indicate that the supply of this power domain is off. Additional construct coverage toggles for this illustrative example are described in the following table:

| Construct Coverage Toggle | Description |
|---|---|
| PowerDomain::simState.m_negedge | The negative edge of the counter may be used to count the number of time intervals when sim State for the current power domain are set to Normal. |
| PowerDomain::simState.m_posedge | The positive edge of the counter may count the number of time intervals when sim State for the current power domain is Corrupt. |
| PowerState::CoverItemToggle isState | The state condition (isState) may identify the toggle count when power state is true or false, or the state Boolean expression is true or false. |
| PowerState::isState.m_negedge | The isolation state negative edge may be used to count the number of time intervals when the power state is false. |
| PowerState: :isState.m_posedge | The isolation state positive edge may be used to count the number of time intervals when the power state is true. |
| StateTransition::CoverItem m_happened | The m_happened variable may count how many times a power state transition took place. |

In some embodiments, to implement one bit of a coverage counter in the emulator, 3.3 emulation primitives are used. Each power intent object (such as a UPF constructs power domain or power state) may include two counters. Capacity increase of the emulator according to some embodiments may be represented by:

$$3.3 * (\text{Number of Bits of the Counter}) * 2 * (\text{Number of Low Power Objects})$$

Including coverage counters in the emulator image may have a negligible impact on the performance of the emulator because of a relatively small coverage capacity (e.g., in operation there may be thousands of low power objects relative to millions of gates executing the emulation). The width of counters can be controlled at compile-time by setting LPCoverageWidth to a smaller number via compiler commands 310.

Figure 4:
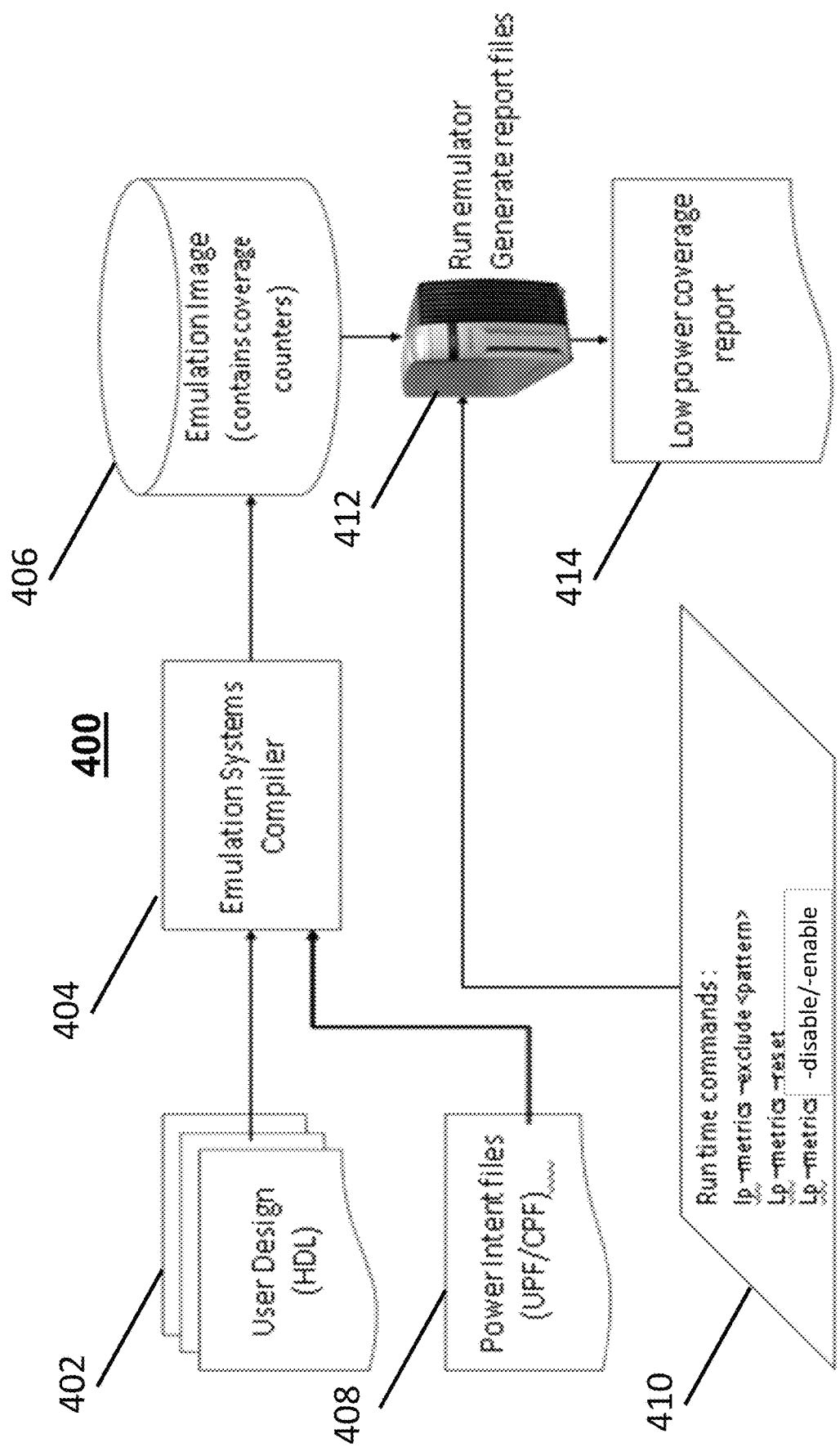
FIG. 4 is a schematic diagram showing a system enabling adjustment of low power report generation, according to an exemplary embodiment.

FIG. 4 is a schematic diagram showing a system that can adjust the test input parameters and output metrics of low power reports, according to an exemplary embodiment 400. Embodiment 400 may include user design 402, power intent files 408, emulation systems compiler 404, emulation image 406, run-time commands 410, emulator 412, and low power coverage report 414. During a test run in the emulator, the counters may be updated automatically and without stopping the emulator. No run time performance cost may be present. Run-time commands 410 may be used to configure the way the counters update, by disabling or resetting them, or excluding them from the reporting. Additional runtime commands control the use of counter values inside the test environment and control reporting.

Because the coverage counters are instrumented in hardware, it may be possible to reset or suspend the counters via run-time commands 410. For example, the timers may be reset or suspended during an initialization period when the user may not want to include UPF coverage counting or when the user suspends the design to allow another user to use the emulator. Similarly, the counters may be reset or disabled individually to allow the user to customize to a particular test scenario. Resetting and/or suspending the counters may be done with no interruption to the emulation run or slowdown in the run.

Figure 5A:
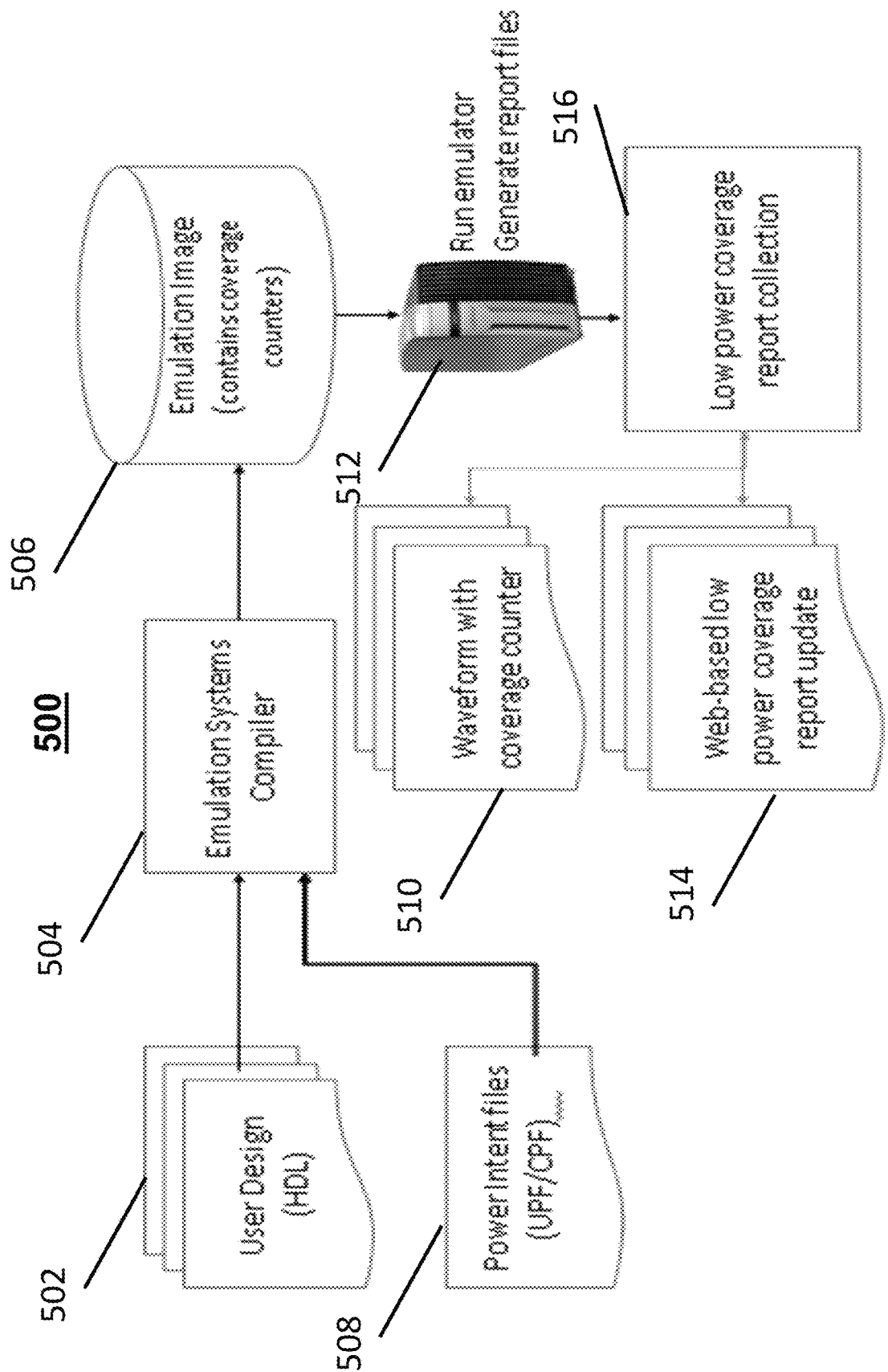
FIG. 5A is a schematic diagram showing coverage report display, including waveforms format and/or a real-time web based coverage report, according to an exemplary embodiment. Additional output formats include text and other database formats.

FIG. 5A is a schematic diagram showing coverage report display, including waveforms format and/or a real-time web based coverage report, according to an exemplary embodiment 500. Additional output formats include text and other database formats. Embodiment 500 may include user design 502, power intent files 508, emulation systems compiler 504, emulation image 506, waveform with coverage counter 510, emulator 512, web-based low power coverage report update 514, and low power coverage report 516.

Counter values may be traced on a waveform with coverage counter 510, providing a time-based view of the changes in the coverage. In operation, the user may use the metrics report output as a summary. To investigate particular results, the user may use the waveform to determine when one or more counts have changed. Similarly, the user may determine from the waveform when other design signals have changed.

The coverage metrics report may be written in a text file or stored in a standard coverage database format. The coverage metrics report may also be written in a web-based support database and shown in a web page such as with web-based low power coverage report update 514 in real-time when the metrics report is generated. The web-based metrics report may be organized based on IC designs and their test scenarios, sorted by the time the report was generated.

The coverage counters may be inputted back into the design during the emulation run to be used as internal triggers to control the tests themselves or to activate different parts of the design. The feedback, or coverage-controlled test execution, may be done via dynamic net lists that allow a small part of the emulation image to be modified. For example, based on the coverage in one part of the design reaching 100% (or any user-specified grade), the test may enter a different mode that loads and executes a different software program to exercise the device under test (DUT).

In one embodiment, by default, the related low power objects in power intent files coverage information may be generated. This information may be adjusted via a run time command when the emulations system is running. For example, an exclude command may be used to exclude some low power objects metrics information. Different objects or attributes may be excluded.

Figure 5B:
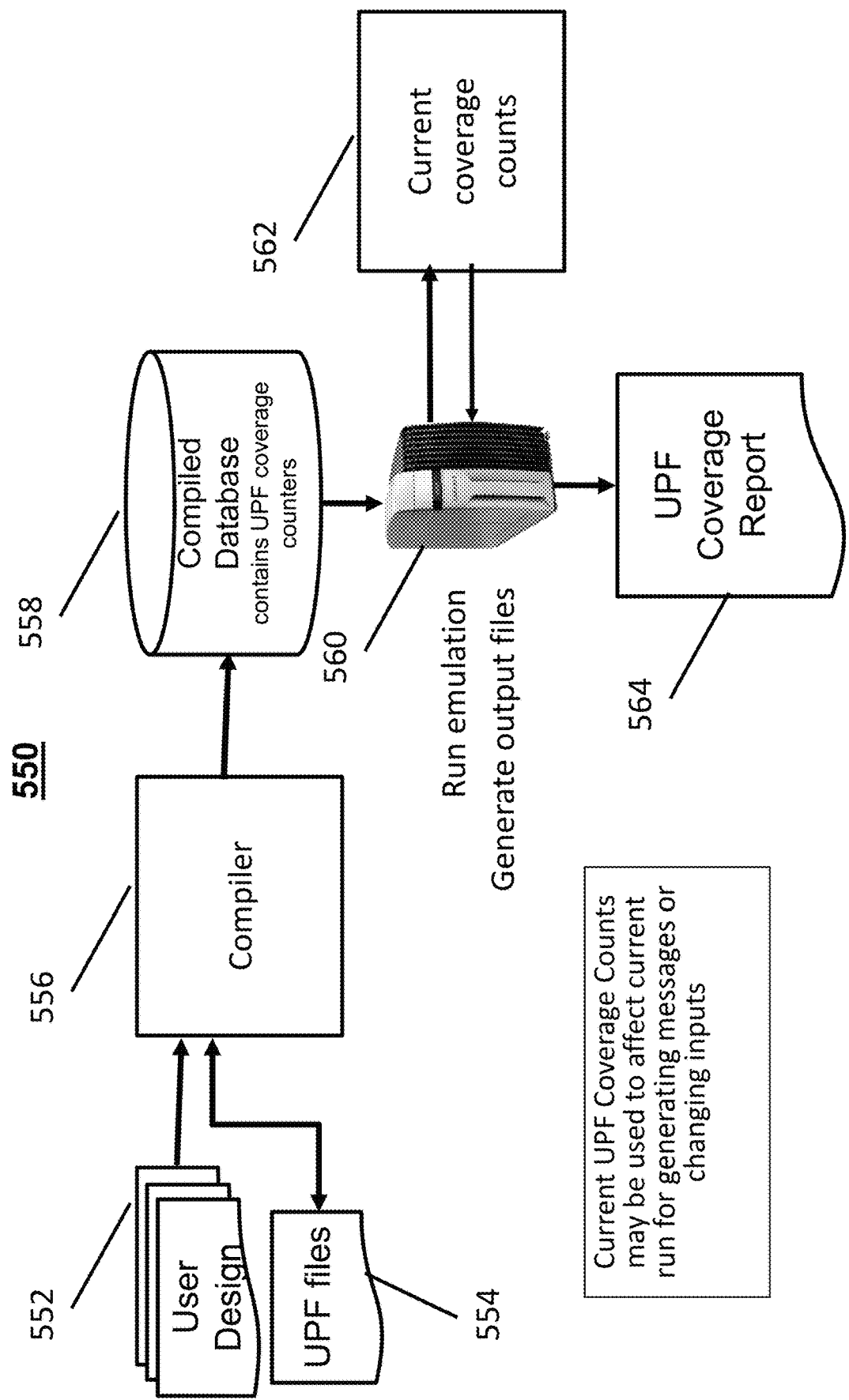
FIG. 5B illustrates current coverage feedback, according to an exemplary embodiment.

FIG. 5B illustrates current coverage feedback, according to an exemplary embodiment 550. Embodiment 550 may include user design 552, UPF files 554, compiler 556, compiled database 558, emulator 560, current coverage counts feedback 562, and UPF coverage report 564. Embodiment 550 illustrates how the user may determine when design signals have changed. For example, the current coverage counts feedback 562 may include feedback that indicates what the current coverage count is for different counters as presented on UPF coverage report 564.

FIG. 6 shows an exemplary set of low power objects or constructs and corresponding coverage items, according to exemplary embodiment 600. The set of power objects may include attributes such as low power object types 602, coverage items 604, coverage toggle 606, and/or capacity increase 608. Low power object type 602 may include objects such as power domain, isolation, retention, power switch, supply net, supply set, supply port state, port state table state, power state, and power state transition, for example.

FIG. 7 shows a sample UPF input file, according to an exemplary embodiment 700. As can be seen in sample UPF input file 700, retention, isolation, and port state are being set. For example, "set_retention" defines the domain for ret_0 to be PD_bank0. Similarly, "set_isolation" sets isol's domain PD_bank1. In another example, two port states are added, VDD_sw1 and VDD_sw2. Then a port state table is created with "create_pst" and the two port states x1off and x1on are added to the table TABLE_1.

FIG. 8 shows an output sample of a coverage report with counter width N=8, according to an exemplary embodiment 800. Coverage report 800 illustrates a sample output of a coverage report taking in sample UPF input file 700 as the input of the power intent. In this example, emulation systems may collect coverage data for UPF constructs, utilize corresponding coverage counters in hardware emulator, update coverage counters when corresponding constructs instantiate, and generate the coverage report automatically at the end of the test run or on-demand during the test run.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method of hardware emulation on a computer, the method comprising:
   receiving, by the computer, a hardware description language file and a low power intent file;
   compiling, by the computer, the hardware description language file and the low power intent file into an emulation image;
   loading, by the computer, the emulation image into an emulator;
   executing, by the computer, the emulation image under a test environment including using a plurality of coverage counters configured for low power coverage, the emulator image comprising a coverage counter instantiated for each of a plurality of low power constructs defined in the low power intent file, wherein the coverage counter is width-adjustable;
   modifying, by the computer, during execution of the emulation image at runtime, an execution setup, based on values of the coverage counters in a feedback loop;
   generating, by the computer, a report file comprising a set of low power coverage metrics based on the plurality of coverage counters; and
   presenting, by the computer, the report file to a user via a user interface containing at least one of: a web-based real-time display of historical and aggregate data, and a waveform view of coverage data and waveforms of design components.

2. The method of claim 1, further comprising:
   generating, by the computer, an instruction to indicate execution of a coverage toggle for each of the plurality of low power constructs identified in the low power intent file, where the coverage toggle has two states and one coverage counter is created for each state.

3. The method of claim 1, wherein a set of coverage counter values are traced on a waveform and presented in the report file via the user interface.

4. The method of claim 1, further comprising presenting one or more options selected from the group consisting of: compiling, resetting, disabling, enabling, and excluding the coverage counter during run-time.

5. The method of claim 1, inputting, by the computer, the plurality of coverage counters into the test environment while running the emulation image, wherein a run-time performance of the emulation is not impacted by inputting the plurality of coverage counters.

6. The method of claim 1, further comprising:
   generating, by the computer, an instruction to indicating execution of a coverage toggle for each of the plurality of low power constructs identified in the low power intent file, where the coverage toggle has one condition and one coverage counter is created for each condition.

7. The method of claim 1, further comprising setting the width of two coverage counters during compiling between 0 and N, where $N=2^n$, and n is greater than or equal to 3.

8. The method of claim 1, wherein the low power intent file is a unified power format file and includes at least one construct selected from the group consisting of power domain, isolation, retention, power switch, supply net, supply set, supply port state, port state table state, power state, and power state transition.

9. The method of claim 1, wherein the low power intent file is a common power format file and includes power domain, isolation, retention, and power mode.

10. A hardware emulation device, the hardware emulation device comprising multiple processors with each processor having its own memory, and:
    at least one of the multiple processors is configured to:
       receive, by the hardware emulation device, a hardware description language file and a low power intent file from the memory;
       compile, by the hardware emulation device, the hardware description language file and the low power intent file into an emulation image;
       load, by the hardware emulation device, the emulation image into an emulator;
       run, by the hardware emulation device, the emulation image under a test environment including using a plurality of coverage counters configured for low power coverage, the emulator image comprising a coverage counter instantiated for each of a plurality of low power constructs defined in the low power intent file, wherein the coverage counter is width-adjustable;

generate, by the hardware emulation device, a report file including a set of low power coverage metrics based on the plurality of coverage counters; and present, by the hardware emulation device, the report file to a user via a user interface, including at least one of: waveforms, text reports, and web-based graphs and text.

11. The hardware emulation device of claim 10, wherein the processor is further configured to generate an instruction to indicate execution of a coverage toggle for each of the plurality of low power constructs identified in the low power intent file, where the coverage toggle has two states and one coverage counter is created for each state.

12. The hardware emulation device of claim 10, wherein a set of coverage counter values are traced on a waveform and presented in the report file via the user interface.

13. The hardware emulation device of claim 10, wherein the processor is further configured to present options for compilation, to reset, or suspend the coverage counter during run-time.

14. The hardware emulation device of claim 10, wherein the processor is further configured to generate an instruction to indicating execution of a coverage toggle for each of the plurality of low power constructs identified in the low power intent file, where the coverage toggle has one condition and one coverage counter is created for each condition.

15. The hardware emulation device of claim 10, wherein the processor is further configured to set the width of two coverage counters during compiling between 0 and N, where $N=2^n$, and n is greater than or equal to 3.

16. The hardware emulation device of claim 10, wherein the low power intent file is a unified power format file and includes at least one construct selected from the group consisting of power domain, isolation, retention, power switch, supply net, supply set, supply port state, port state table state, power state, and power state transition.

17. The hardware emulation device of claim 10, wherein the low power intent file is a common power format file and includes power domain, isolation, retention, and power mode.

* * * * *